United States Patent [19]
Hartmann et al.

[11] Patent Number: 4,609,986
[45] Date of Patent: Sep. 2, 1986

[54] PROGRAMMABLE LOGIC ARRAY DEVICE USING EPROM TECHNOLOGY

[75] Inventors: Robert F. Hartmann, San Jose; Yiu-Fai Chan, Saratoga; Robert Frankovich, Cupertino; Jung-Hsing Ou, Sunnyvale, all of Calif.

[73] Assignee: Altera Corporation, Santa Clara, Calif.

[21] Appl. No.: 620,451

[22] Filed: Jun. 14, 1984

[51] Int. Cl.[4] .............................................. G06F 7/38
[52] U.S. Cl. ..................................... 364/200; 364/716
[58] Field of Search ... 364/200 MS File, 900 MS File, 364/716; 365/185

[56] References Cited

U.S. PATENT DOCUMENTS

| | | | |
|---|---|---|---|
| 3,974,366 | 8/1976 | Hebenstreit | 364/900 X |
| 4,034,356 | 7/1977 | Howley et al. | 364/716 X |
| 4,037,089 | 7/1977 | Horninger | 364/900 X |
| 4,195,352 | 3/1980 | Tu et al. | 364/900 |
| 4,207,556 | 6/1980 | Sugiyama et al. | 364/716 X |
| 4,237,542 | 12/1980 | Cukler | 364/900 |

Primary Examiner—Thomas M. Heckler
Attorney, Agent, or Firm—Hamrick, Hoffman, Guillot & Kazubowski

[57] ABSTRACT

An electrically programmable, eraseable and reprogrammable, monolithic integrated circuit logic array device is disclosed. The device includes a plurality of three types of logic array macrocells, each including an AND array matrix of EPROM transistors configured to form a plurality of "product terms" which are fed into another matrix comprised of "OR" gates, the outputs of which form sum-of-products expressions of the inputs to the AND arrays. Also contained in the macrocells are simple EPROM transistors which, when combined with other appropriate circuitry, form control elements, a plurality of storage registers (D flip-flops), feedback drivers, input drivers and output drivers, all integrated on the same substrate. The input drivers and feedback drivers provide input signals to the AND arrays and the outputs from the D flip-flops can be directed to either the feedback drivers or the output drivers. Control of data sources and destinations is determined by the control elements which in turn are determined by single EPROM transistors. Thus, the architecture as well as the logic function is programmable.

18 Claims, 6 Drawing Figures

Fig.1

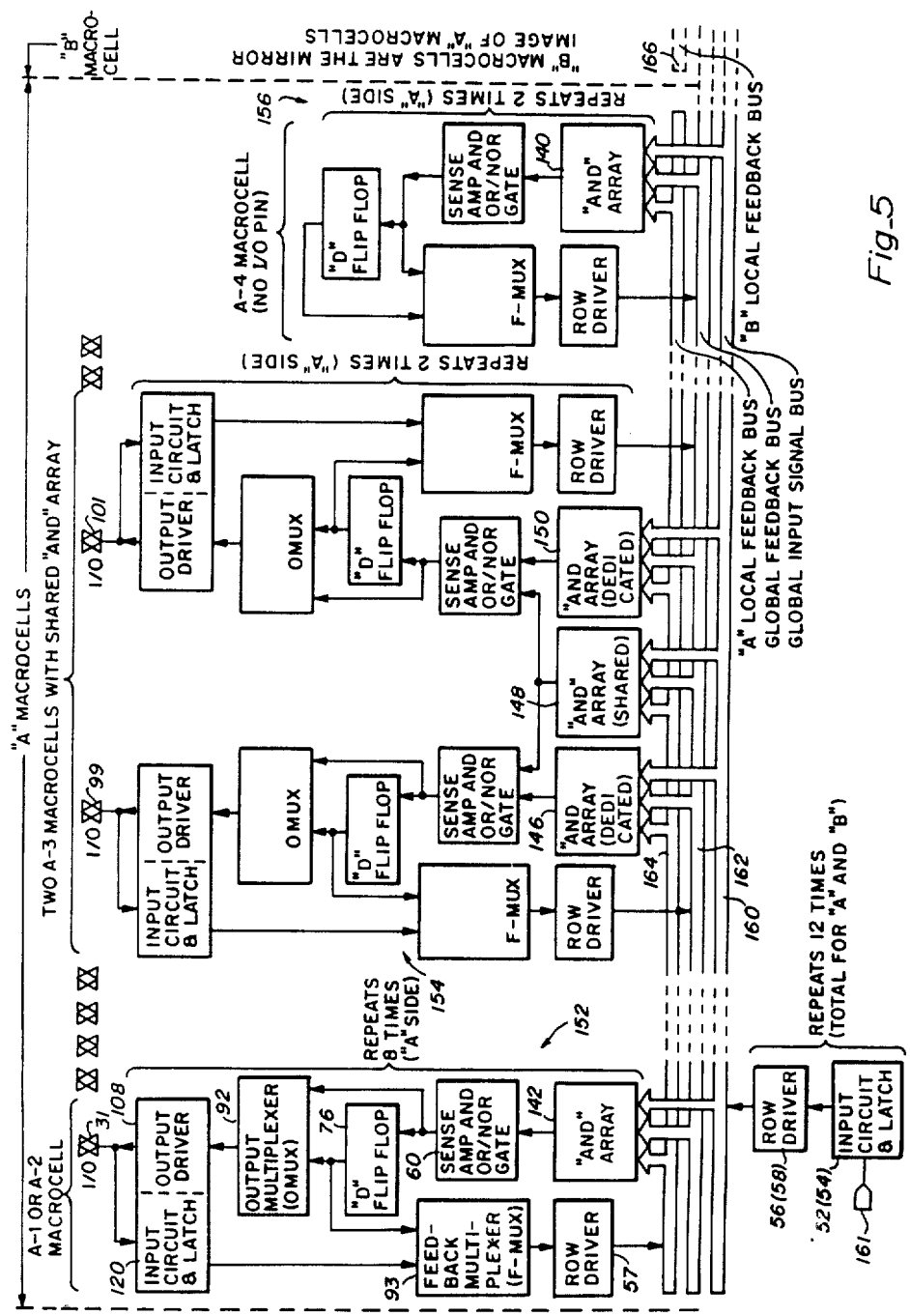
Fig_5

PROGRAMMABLE LOGIC ARRAY DEVICE USING EPROM TECHNOLOGY

BACKGROUND OF THE INVENTION

1. Field of the Invention

The present invention relates generally to programmable logic array devices and more particularly to an improved erasable, electrically programmable logic device made using CMOS EPROM Floating Gate technology.

2. Related Application

The subject matter of this application is related to our co-pending U.S. patent application Ser. No. 607,018, filed May 3, 1984, and entitled "Programmable Logic Array Device Using EPROM Technology". The disclosure of such application is expressly incorporated herein by reference to provide a fundamental explanation of the way in which EPROM transistors may be used to form programmable logic arrays (PLAs).

DISCUSSION OF THE TECHNOLOGY AND PRIOR ART

The integrated circuit technology used in the fabrication of the present invention is CMOS Floating Gate (CMOS EPROM). Floating gate technology allows "programming" of certain transistors such that when normal operating voltages are applied (0 to 5 volts) the "programmed" transistor acts like an open circuit. In their unprogrammed state, these same transistors will conduct when 5 volts is applied to the gate terminal and will appear as an open circuit when 0 volts is applied to the gate terminal.

In the past, the normal application of the technology was to manufacture electrically programmable read only memories (EPROM). The programmable element in EPROM technology is a two layer polysilicon MOS transistor. By changing the circuits which access the array of programmable elements, programmable logic arrays (PLA) can be realized. Prior art U.S. Patents include: Kahng, U.S. Pat. No. 3,500,142, Frohman-Bentchkowsky, U.S. Pat. No. 3,660,819; Frohman-Bentchkowsky, U.S. Pat. No. 3,728,695; Frohman-Bentchkowsky, U.S. Pat. No. 3,744,036; Frohman-Bentchkowsky, U.S. Pat. No. 3,755,721; Frohman-Bentchkowsky, U.S. Pat. No. 3,825,946; Simko et al, U.S. Pat. No. 3,984,822; and Lohstroh et al, U.S. Pat. No. 4,019,197.

Programmable logic arrays and similar circuit elements such as programmable array logic (PAL) have been in existence for many years. See for example, the U.S. Patents to: Crawford et al, U.S. Pat. No. 3,541,543; Spencer, Jr., U.S. Pat. No. 3,566,153; Proebsting, U.S. Pat. No. 3,702,985; Greer, U.S. Pat. No. 3,816,725; Greer, U.S. Pat. No. 3,818,452; Greer, U.S. Pat. No. 3,849,638. The first realizations were mask programmed. An example is a P channel MOS device manufactured by Texas Instruments during 1968-1970.

More recently, the technology of choice has been fuse programmable bipolar technology made by manufacturers such as Signetics, Monolithic Memories, Inc., Advanced Micro Devices, Harris Semiconductor and others.

The complexity of PLAs and PALs is given in terms of:
(a) The number of Inputs;
(b) The number of Product Terms in the AND array;
(c) The number of Sum Terms in the OR array;
(d) The number of Storage Elements (FLip Flops);
(e) The number of Feedback lines from the output of the OR array (or the Flip Flops) to the AND array; and
(f) The number of Outputs.

SUMMARY OF THE PRESENT INVENTION

The present invention relates to an electrically programmable integrated circuit with a logic complexity of approximately 1200 (2-input) NAND gates. The preferred embodiment is designated the ALTERA EP1200 and can generally be classed as a programmable logic array (PLA) with substantial additional circuitry such that many combinations of inputs, outputs and feedback can be accommodated.

The EP1200 has the following characteristics:
(a) 36 Inputs (from off chip) to the AND array;
(b) 236 Product Terms (P-Terms);
(c) 28 Sum Terms (Fixed OR Structure with from 4 to 16 P-Terms each);
(d) 28 D type Flip Flops;
(e) 56 Feedback lines; and
(f) 24 Outputs.

In addition to the above there are several other features of the EP1200. These are listed below:
(a) One of the inputs (Pin #38) to the AND array also may serve as a CLOCK to the D Flip-Flops;
(b) The P-Terms are grounded as follows:
  (1) 4 each to 4 fixed OR/NOR gates (16 P-Terms);
  (2) 6 each to 4 fixed OR/NOR gates (24 P-Terms);
  (3) 8 each to 8 fixed OR/NOR gates (64 P-Terms);
  (4) 10 each to 4 fixed OR/NOR gates (40 P-Terms);
  (5) 2 sets of P-terms grouped as follows:
    20 P-terms shared between two adjacent OR/NOR gates where 8 P-terms are dedicated to each OR/NOR gate and 4 P-terms are common to both adjacent OR/NOR gates (40 P-terms).
  (6) 2 sets of P-terms grouped as follows:
    20 P-terms shared between two adjacent OR/NOR gates where 12 P-terms are dedicated to one OR/NOR gate and 4 P-terms are dedicated to the adjacent OR/NOR gate and 4 P-terms are common to both adjacent OR/NOR gate (40 P-terms).
  (7) 1 each to the Output Enable (OE) of 1 group of output drivers, (6 groups of 4) (6 P-Terms);
  (8) 6 P-Terms for asynchromous Reset signals to the D-Flip Flops;
(c) Each of the Sum Terms from the OR/NOR gate can be either "active high" or "active low";
(d) The I/O pins can output either combinatorial data (active high or active low) or registered data from the D flip flops (active high or active low);
(e) Feedback can be from one of the following three data sources; the I/O pins, the output of the register, the output of the OR gate (from A-4 and B-4 cells to be discussed later);
(f) Selection of output data and feedback data is made by programming EPROM transistors in the Architectural Feature Select Section;
(g) EPROM transistors are used for all programmable elements. Thus, the device is electrically programmable and UV erasable.

The EP1200 is intended to be used as a replacement part for standard family logic components such as the 74LSxx series and the more recent 74HCxx and 74HCTxx (CMOS) series. As a logic replacement device, a single EP1200 will typically replace from 20 to 50 standard family logic components. The reasons for making such substitutions are:

(a) Greater logic density (more logic in less board area); and
 (b) Lower system power The ultimate objective of the present invention is to produce a more powerful system for lower overall systems cost.

Typical applications for the EP1200 are for random logic replacements such as decoders, comparators and multiplexers and for state machines. Logic replacement applications are the combinatorial features of the EP1200 while the state machines use the registered feedback features.

These and other features and advantages of the present invention will become apparent to those skilled in the art after having read the following detailed description of the preferred embodiment shown in the several figures of the drawing.

IN THE DRAWING

FIG. 5 is a block diagram showing the functional characteristics and interrelationships of the component macrocells and buses depicted in FIG. 1.

DESCRIPTION OF THE PREFERRED EMBODIMENT

Figure 1:
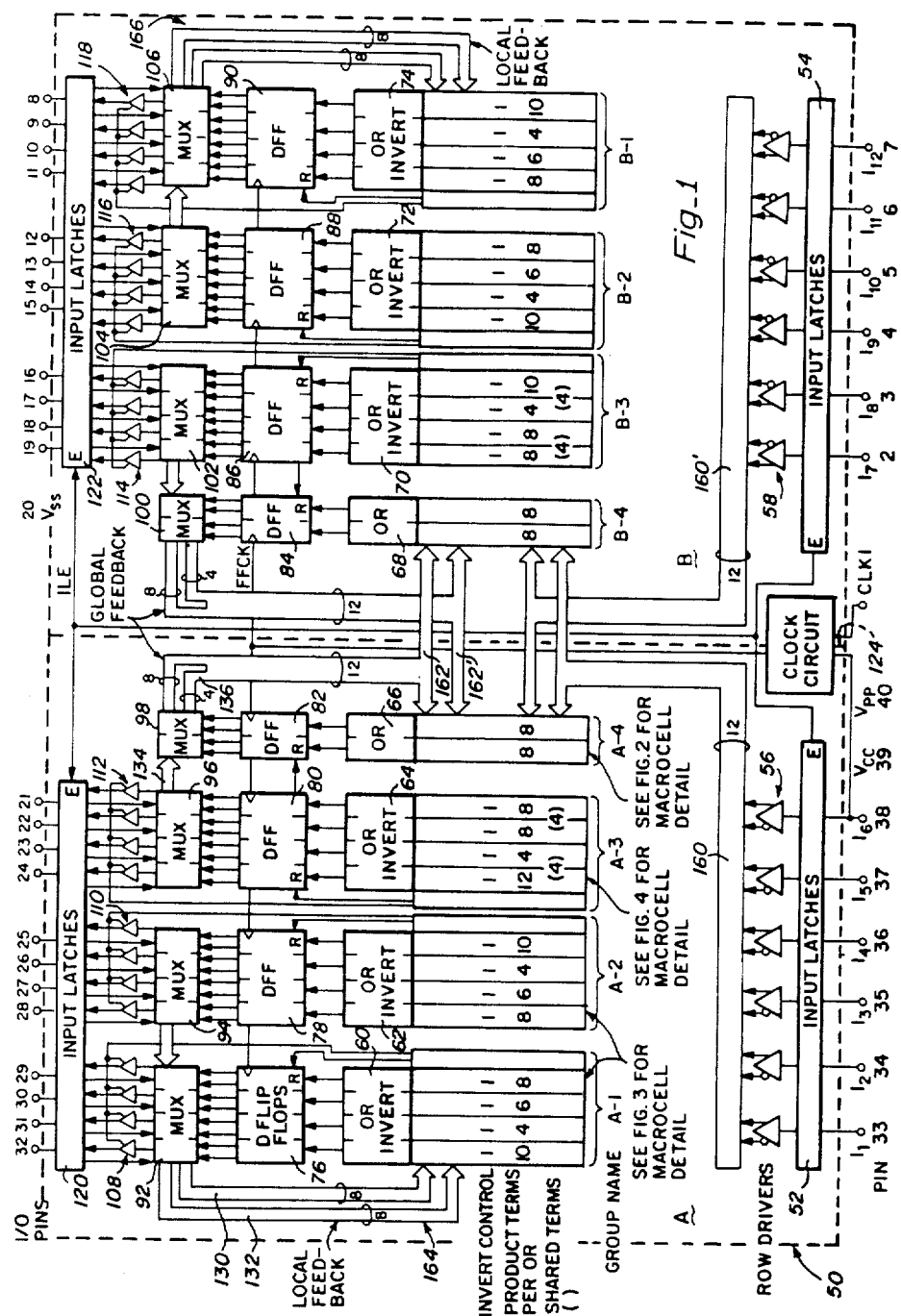
FIG. 1 is a diagram schematically representing an improved programmable logic array device in accordance with the present invention.

Turning now to the drawing wherein like numbers refer to the same or similar elements in the several figures, FIG. 1 is a block diagram showing a monolithic integrated circuit in accordance with the present invention. The illustrated device, shown generally at 50 is a 40-pin device, the pins of which are labeled 1-40. The device is designated the ALTERA EP1200 and is manufactured by the assignee of the present application. The major circuit elements are the input latches 52 and 54 respectively serving Pins 33-38 and 2-7, the row drivers 56 and 58, the programmable AND array groups A and B, OR gates 60-74, the D flip-flops 76-90, the multiplexers (MUX) 92-106, the output drivers collectively shown in groups 108-118, and the input latches 120 and 122 respectively serving Pins 21-32 and 8-19. This initial description will concern itself primarily with the interconnections between the various blocks rather than detailed descriptions of the blocks and the elements. To the extent that details of the various circuit components are not disclosed in our above-identified copending application, FIGS. 2-6 are included herein.

As may be noted, the circuit is symmetrical about the dashed line 124. AND array inputs are applied through input pins 33-38 (I1-I6) and 2-7 (I7-I12) via the input latches 52 and 54 and row drivers 56 and 58, respectively and from the MUX circuits 92-106 as either global or local feedback. The AND arrays are physically partitioned into two groups (designated A and B) each with a total of 64 inputs and 118 product terms. The AND arrays are further partitioned into 4 sub-groups designated A-1, A-2, A-3 and A-4 for the A side and B-1, B-2, B-3 and B-4 for the B side. Since the A and B sides are mirror images of each other, most of the following discussion will be directed to the A side only, with the B side description being included by implication. Also, sub-groups A-2 and A-3 are identical and only A-2 will be discussed in detail.

Sub-groups A-1, A-2 and A-3 each consist of 4 macrocells which are similar in all respects except for the number of product terms. Group A-4 is different in three respects: first, there is no I/0 cell associated with the macrocells in group A-4; second, group A-4 only contains 2 macrocells; and third, the MUX 98 can be configured to provide registered or combinational feedback. Group A-4 macrocells are referred to as "buried" macrocells (i.e., no direct connection is made to an I/0 pin).

Groups A-1 and A-2 are different from group A-3 in two respects: first, group A-1 and A-2 provide "local feedback" only, i.e., the feedback only drives the A half of the chip via bus lines 130 and 132. By contrast, group A-3 provides "global feedback", i.e., feedback is to both the A and B half of the chip, via bus lines 134, note that group A-4 also provides global feedback, via bus lines 136; second, group A-3 allows for sharing product terms between individual macrocells. This is shown schematically in FIG. 4.

BURIED REGISTER, GLOBAL FEEDBACK

Figure 2:
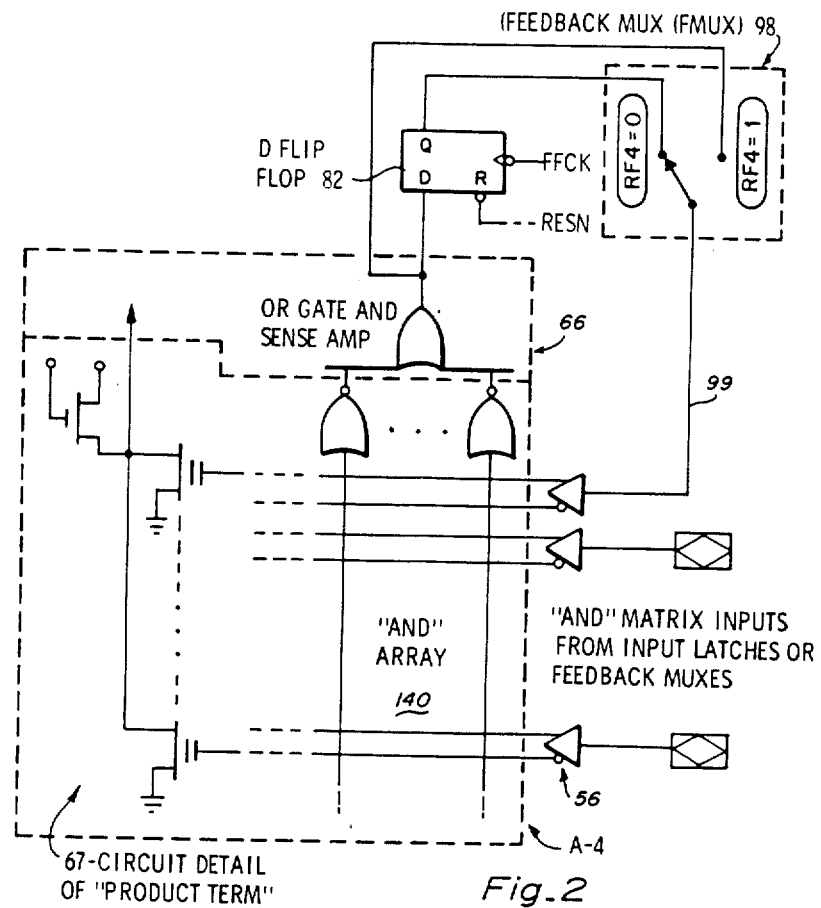
FIG. 2 is a diagram schematically illustrating a first type of macrocell incorporated in the device shown in FIG. 1.

Referring now to FIG. 2 which is a simplified schematic and logic diagram of an A-4 (B-4) macrocell, the buried register and global feedback features will be discussed. The circuit consists of a programmable "AND" array 140 made up of EPROM transistors as described in our said co-pending application. A circuit detail of a single product term of the AND array 140 is shown for reference at 67. In a preferred embodiment, the AND array for the A-4 macrocell has 8 product terms, each with 64 inputs, feeding the OR gate and sense amplifier 66. Inputs to the AND array 140 are from input latches 52 and 54 (FIG. 1), the feedback multiplexer 98 (FIG. 2), and from other feedback multiplexers 92, 94, 96, 100 and 102 (FIG. 1). The input latches 52 and 54 are fed data from input pins I1-I12 while the feedback multiplexer 98 is fed data from D flip-flops 82 or the output of the OR gate 66. Signals are fed to the AND array 140 as true and complement signal pairs. This is indicated in FIGS. 1 and 2 by the symbols shown at 56.

As illustrated, the output of the OR gate 66 feeds the D input of a D flip-flop 82 and one input of the feedback multiplexer (FMUX) 98. The output of FMUX 98 feeds back into the AND array as indicated at 99. The FMUX selects data (to be fed back) from either the output of the flip-flop 82 or from the OR gate 66. The selection is controlled by the state of an EPROM transistor as explained in our said copending application. In the erased state, the flip flop output is chosen as the data source. In the programmed state, the OR gate output is chosen. This allows either registered feedback, which is useful in state machine applications, or "combinatorial" feedback where complex logic is being implemented. Feedback from A-4 (also B-4) macrocells is "global", that is, the feedback goes to all A and B macrocells via bus 136 (FIG. 1).

The D flip-flop 82 has a clock signal labeled FFCK which is common to all other D flip-flops. The reset signal is labeled RESN and is common with other A-3 and A-4 macrocells.

I/O MACROCELL, LOCAL FEEDBACK

Figure 3:
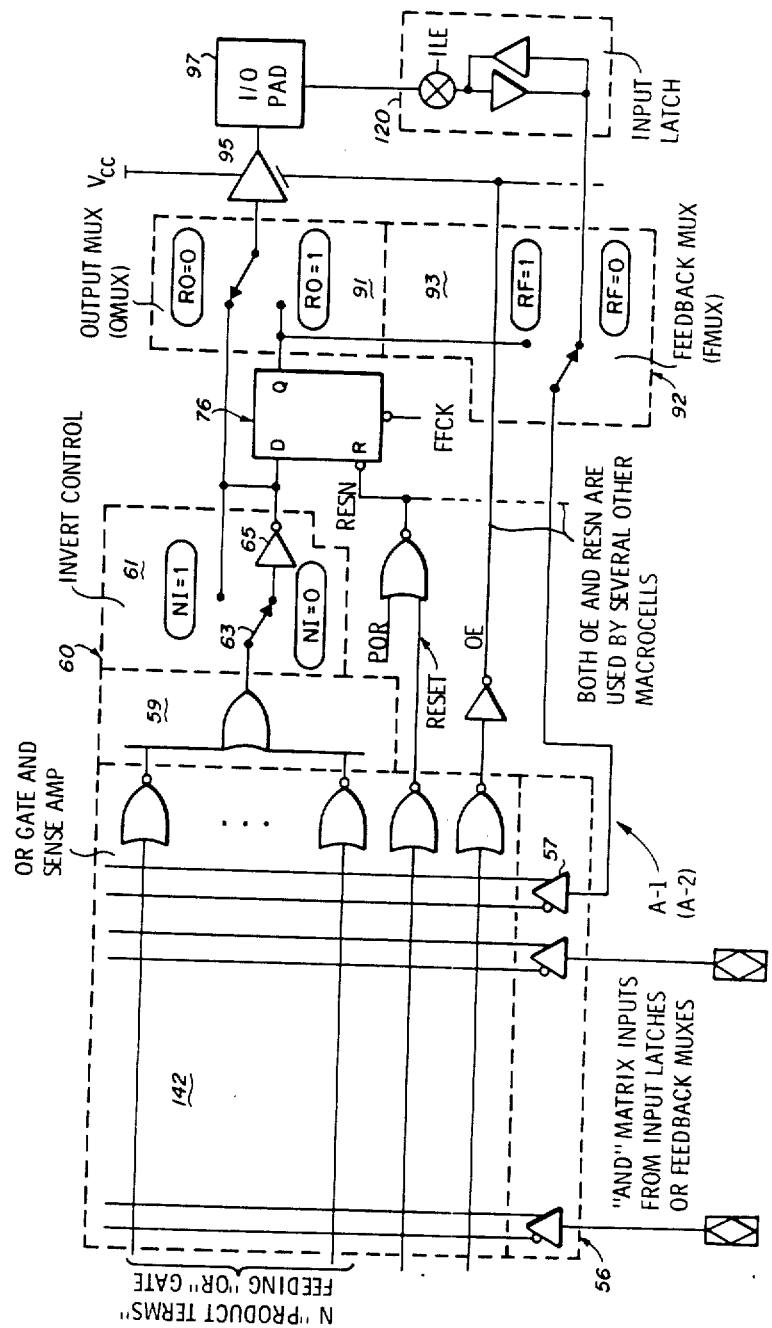
FIG. 3 is a diagram schematically illustrating a second type of macrocell incorporated in the device shown in FIG. 1.

In FIG. 3, a simplified schematic and logic diagram is shown of an A-1 or A-2 (B-1 or B-2) macrocell. Each such macrocell consists of a programmable AND array 142 feeding an OR gate sense amplifier 59. (Similar to A-4 described previously). The output of the OR gate 59, after passing through an invert control circuit 61, feeds a D flip-flop 76, an output multiplexer (OMUX) 91 and an FMUX 93. The invert control circuit 61 is a two position switch 63 controlled by an EPROM bit (not shown) which causes the OR output from 59 to either pass through an inverter 65 or to bypass the inverter. Thus, the OR output data can be selectively inverted.

The OMUX 91 receives data from the D flip-flop 76 or the output of the invert control circuit and passes the data to the I/O pad 97 via the output driver 95. The output driver 95 has an output enable which is controlled by a P term (OE) from the AND array 142. This OE signal controls the four output drivers (other three not shown) associated with the A-1 macrocells. There is another OE signal to control the A-2 macrocell output drivers. The FMUX 92 receives data from the output of the D flip-flop 76 or the I/O pad 97 via the input circuit and latch 120. The output of the FMUX 92 feeds back to the AND array via a row driver 57. Feedback from A-1 and A-2 (B-1 and B-2) is local only via buses 130 and 132 (FIG. 1). That means feedback from A-1 and A-2 (B-1 and B-2) macrocells only feeds the AND arrays on one side, i.e., the A (B) side. While this arrangement somewhat limits the utility of the part, there is a significant savings in silicon chip area because the (A-1, A-2 and B-1, B-2) row lines from the A and B side stop at the center of the chip (see FIG. 1) allowing the same horizontal bus to be used. The net savings is the area that would be used by 16 row lines. This reduces the array from 80 to 64 row lines for an array area savings of 20%.

In FIG. 3, the variable "N" is used to indicate the number of Product Terms feeding the OR gate. The number of terms in group A-1 varies. The four macrocells in A-1, A-2, B-1 and B-2 each have 10, 4, 6 and 8 P-terms. This is indicated as product terms per OR in FIG. 1. The variable product terms (P-terms) again saves chip area because some logic functions require few product terms while others require many. Logic functions can then be "fit" into the most appropriate macro cell. Another alternative could have been to give all macrocells the expected maximum number of P terms. This would result in considerable P-term waste in the typical application. For example, if a maximum of 16 P-terms has been used in every macrocell, the total P-term count would have been 460 versas 236 as in the present configuration. The array area would have increased almost 100%.

I/O MACROCELL, P-TERM SHARING, GLOBAL FEEDBACK

Figure 4:
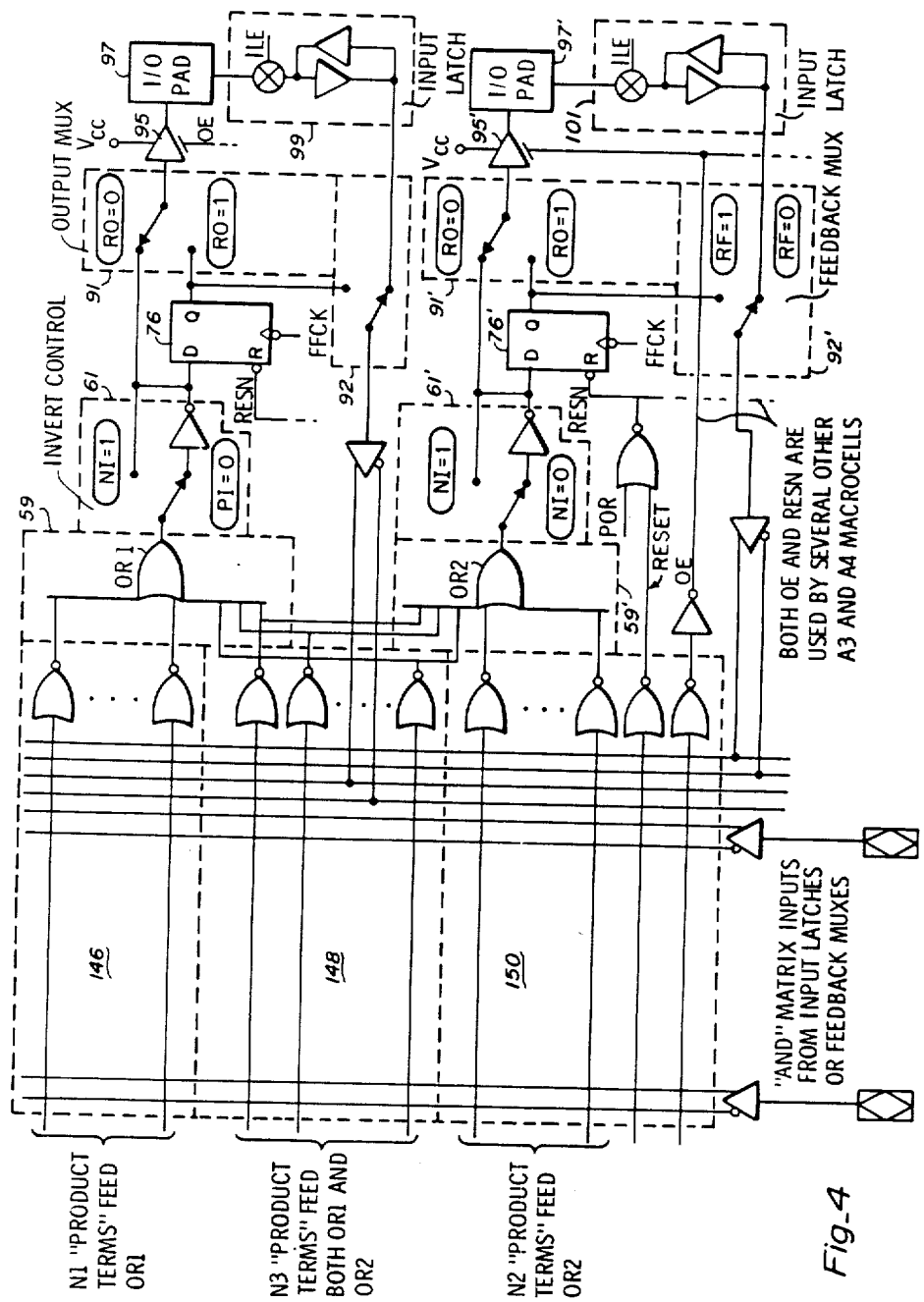
FIG. 4 is a diagram schematically illustrating a third type of macrocell incorporated in the device shown in FIG. 1.

A-3 macrocells as shown in FIG. 4 are similar in most respects to the A-1 and A-2 macrocells described previously. They consist of a programmable AND array, OR gate and sense amps 59, invert controls 61, D flip-flops 76, OMUXs 91, output drivers 95, I/O pads 97, input circuits and latches 99 and 101 and FMUXs 92. Data sources and destinations for the invert controls and OMUXs are similar to those of A-1.

Shared P Terms. One significant feature of the A-3 macrocells is the use of shared P terms. Two adjacent A-3 macrocells are shown in FIG. 4. Three AND arrays 146, 148 and 150 are shown. The first (146) is indicated as having "N1" product terms feeding OR gate OR1 and the second (150) is indicated as having "N2" product terms feeding OR2. The third AND array 148 is indicated as having "N3" product terms which feed both OR1 and OR2. They are "shared" by both OR1 and OR2.

The number of terms N-1, N-2 and N-3 can vary from cell to cell. The number of dedicated and shared product terms per OR gate is indicated in FIG. 1. as product terms per OR and shared terms. In the EP1200 design, the four macrocells of group A-3 have 4 shared terms between two macrocells which have 12 and 4 dedicated product terms, and 4 shared terms between two other macrocells which have 8 and 8 dedicated product terms. Thus, logic functions requiring less then 4 and up to 16 product terms can be accommodated with minimum waste.

Global Feedback. The feedback from A-3 (B-3) macrocells via bus 134 is global. That is, feedback signals are available to all AND arrays on both the A and B sides.

FIG. 5 is a block diagram schematically illustrating the entire circuit in simplified block diagram form. The three types of macrocells appearing on each side of the device 50 are shown at 152, 154 and 156 along with their various interconnecting data paths. Four signal buses 160-166 are shown. These are:

(a) The Global Input Signal Bus 160—This bus takes signals from the input pads 161 and passes them to all AND arrays on both sides of the device.

(b) The Global Feedback Bus 162—This bus contains the feedback signals from all A-3, A-4, B-3 and B-4 macrocells. This bus feeds all AND arrays on both the A side and B side.

(c) The A side Local Feedback Bus 164—This bus contains the feedback signals from the A-1 and A-2 macrocells. It feeds the A side AND arrays only.

(d) The B side Local Feedback Bus 166—This bus contains the feedback signals from the B-1 and B-2 macrocells. It feeds the B side AND arrays only.

The purpose of this circuit is to show in simplified schematic form the functional interrelationships of the various component parts of the device together with the way in which such parts communicate with each other via the four major buses. For example, a signal I1 input at pin 33 which corresponds to chip pad 161 might flow through input circuit and latch 52, row driver 56 and bus 160 to AND array 142 wherein due to the prior programming thereof might give rise to a particular output that is sensed by the sense amp and OR/NOR gate 60. The output of gate 60 will then be transmitted to the D flip-flop 76 and OMUX 92. OMUX 92 may then communicate either the output of the sense amp 60 or the D flip-flop 76 to driver 108 which in turn delivers the signal to I/O pin 31. Similarly, FMUX 93 may be configured to couple either the output of D flip-flop 76 or a signal stored in the I/O input circuit and latch 120 to the row driver 57. Row driver 57 may then couple the signal back into the AND array 142 or any other AND arrays on side A via bus 164. If it enters AND array 146, the signal may then be routed to either the I/O 99 or be coupled into bus 162 via either of the alternative paths illustrated.

If alternatively, the signal is input to AND array 148, it may find its way to either or both of the I/O ports 99 and 101, or be returned to the global feedback bus 162 for input to another AND array on either side of the device. Moreover, if the signal is input to AND array 140, it may be recirculated either directly from the sense amp and OR gate (combinatorial feedback) or after being clocked by the D flip-flop (registered feedback), to the bus 162.

It will thus be apparent that the present invention provides substantial range of choice of programming options selectable by a user.

Figure 6:
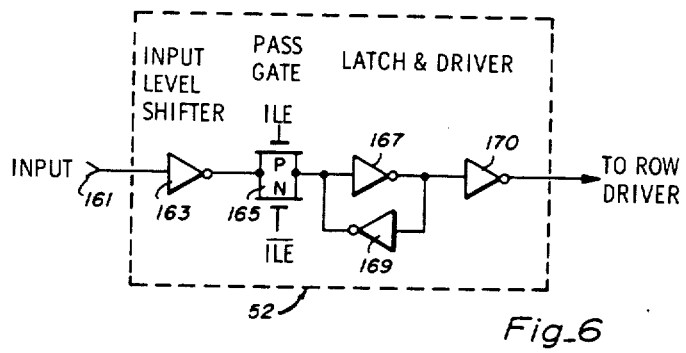
FIG. 6 is a diagram schematically illustrating an input circuit and latch of the type utilized in the embodiment shown in FIG. 1.

FIG. 6 is a schematic and logic diagram of the input (level shifter) circuit and input latch 52. Signals come onto the chip via the input pads to an input level shifting inverter 163. This inverter translates TTL level inputs signals to CMOS level signals. The signal from the level shifting inverter 163 is passed through a transmission gate 165 made up of a P-channel transistor and an N-channel transistor. These transistors are controlled by signals ILE and $\overline{ILE}$ respectively. When ILE is a logic 0, signals are passed to the three inverters 167, 169, and 170 which respectively make up the latch and driver from which the signal is input to the ROW driver. When ILE goes to logic 1, the transistors turn OFF, isolating the input level shifter 163 from the latch and driver 167-170. The latch and driver "remembers" the state of the input as ILE makes its transition from zero to one and the input data is said to be latched.

All inputs of the EP1200 have latches. This feature allows the EP1200 to capture signals at its inputs by switching ILE at the appropriate time. This is especially usefull when data at the inputs can be guaranteed to be stable only during certain intervals. Without this input latch, an external circuit would have to be supplied for this purpose.

Although the present invention has been described in terms of a preferred embodiment, it will be appreciated that other alterations and modifications may be apparent to those skilled in the art. It is therefore intended that the following claims be interpreted as covering all such alterations and modifications as fall within the true spirit and scope of the invention.

What is claimed is:

1. A programmable integrated circuit logic array device, comprising:

a plurality of input terminals for receiving input signals;

a plurality of I/O terminals for receiving input signals and/or transmitting output signals;

a first plurality of macrocells each including at least a first programmable AND array having a first plurality of memory cells arranged in addressable rows and columns, each said cell being individually programmable to contain logic data corresponding to the memory state of the cell, first sensing means connected to said first AND array, said first sensing means being responsive to certain ones of said input signals and operative to detect the memory state of one or more of said cells and to develop a corresponding first data signal, first signal storage means, first feedback means, and first multiplexing means for selectively coupling said first data signal to one of said I/O terminals, to said first storage means, or to said first feedback means; and a plurality of data buses including a global input signal bus for coupling input signals from said input terminals to a first group of cells in the AND arrays of each said macrocell, a local feedback bus for coupling signals applied to the feedback means of at least some of said macrocells to a second group of cells of at least some of said macrocells, and a global feedback bus for coupling data signals applied to some of said feedback means to a third group of cells of all of said AND arrays of said macrocells.

2. A programmable integrated circuit logic array device as recited in claim 1 and further comprising:

a second plurality of macrocells each including a programmable AND array having a plurality of memory cells arranged in addressable rows and columns, each said cell being individually programmable to contain logic data corresponding to the memory state of the cell, second sensing means responsive to certain ones of said input signals and operative to detect the memory state of one or more of said cells and to develop a corresponding data signal, second signal storage means, second feedback terminal means, and second multiplexing means for coupling said second data signal to said second storage means or to said second feedback means.

3. A programmable integrated circuit logic array device as recited in claim 2 and further comprising:

a third plurality of programmable AND arrays, various ones of which are shared by pairs of some of said first macrocells such that the sensing means of each macrocell sharing ones of said third arrays also detect the memory state of the cells of the shared AND arrays.

4. A programmable integrated circuit logic array device as recited in claim 3 and further comprising:

a plurality of input latching circuits each coupling one of said input terminals to said input signal bus whereby input signals applied to said input terminals are maintained stable during certain intervals of time.

5. A programmable integrated circuit logic array device as recited in claim 4 wherein said input latching circuits include an input level shifting inverter stage, an output driver element, and a switchable pass gate and latch coupling the inverter stage to the driver element.

6. A programmable integrated circuit logic array device as recited in claim 5 wherein said memory cells are formed using EPROM technology.

7. A programmable integrated circuit logic array device as recited in claim 6 wherein each said sensing means includes at least one OR gate coupled to a plurality of the cells of a corresponding AND array, and each said AND array has a selectable number of product terms per OR gate.

8. A programmable integrated circuit logic array device as recited in claim 7 wherein each said multiplexing means includes a first switching means for connecting either the output of a corresponding sensing means or the output of a corresponding signal storage means to one of said I/O terminals.

9. A programmable integrated circuit logic array device as recited in claim 8 wherein each said multiplexing means further includes a second switching means operative to couple either the output of said corresponding sensing means or one of said I/O terminals to said feedback means.

10. A programmable integrated circuit logic array device as recited in claim 2 wherein said memory cells are formed using EPROM technology.

11. A programmable integrated circuit logic array device as recited in claim 2 wherein each said sensing means includes at least one OR gate coupled to a plurality of the cells of a corresponding AND array, and each said AND array has a selectable number of product terms per OR gate.

12. A programmable integrated circuit logic array device as recited in claim 1 and further comprising:
a plurality of input latching circuits each coupling one of said input terminals to said input signal bus whereby input signals applied to said input terminals are maintained stable during certain intervals of time.

13. A programmable integrated circuit logic array device as recited in claim 12 wherein said input latching circuits include one input level shifting inverter stage, an output driver element, and a switchable pass gate and latch coupling the inverter stage to the driver element.

14. A programmable integrated circuit logic array device as recited in claim 1 wherein said first multiplexing means includes a first switching means for connecting either the output of said first sensing means or the output of said first signal storage means to one of said I/O terminals.

15. A programmable integrated circuit logic array device as recited in claim 14 wherein said first multiplexing means further includes a second switching means operative to couple either the output of said first sensing means or one of said I/O terminals to said first feedback means.

16. A programmable integrated circuit logic array device as recited in claim 1 and further comprising:
a second plurality of programmable AND arrays, various ones of which are shared by pairs of some of said first macrocells such that the sensing means of each macrocell sharing ones of said second AND arrays also detect the memory state of the cells of the shared AND arrays.

17. A programmable integrated circuit logic array device as recited in claim 1 wherein said memory cells are formed using EPROM technology.

18. A programmable integrated circuit logic array device as recited in claim 1 wherein each said sensing means includes at least one OR gate coupled to a plurality of the cells of a corresponding AND array, and each said AND array has a selectable number of product terms per OR gate.

* * * * *